US009761467B2

(12) United States Patent
Rue et al.

(10) Patent No.: US 9,761,467 B2
(45) Date of Patent: Sep. 12, 2017

(54) GAS INJECTION SYSTEM WITH PRECURSOR FOR PLANAR DEPROCESSING OF SEMICONDUCTOR DEVICES USING A FOCUSED ION BEAM

(71) Applicant: FEI Company, Hillsboro, OR (US)

(72) Inventors: Chad Rue, Portland, OR (US); Clive D. Chandler, Portland, OR (US)

(73) Assignee: FEI Company, Hillsboro, OR (US)

( * ) Notice: Subject to any disclaimer, the term of this patent is extended or adjusted under 35 U.S.C. 154(b) by 217 days.

(21) Appl. No.: 14/747,491

(22) Filed: Jun. 23, 2015

(65) Prior Publication Data

US 2015/0294885 A1 Oct. 15, 2015

Related U.S. Application Data

(63) Continuation of application No. 13/910,761, filed on Jun. 5, 2013, now Pat. No. 9,064,811.

(Continued)

(51) Int. Cl.
| | |
|---|---|
| *C23C 14/00* | (2006.01) |
| *H01L 21/67* | (2006.01) |
| *H01J 37/305* | (2006.01) |
| *H01L 21/3213* | (2006.01) |
| *H01L 21/3065* | (2006.01) |

(Continued)

(52) U.S. Cl.
CPC .... *H01L 21/67069* (2013.01); *H01J 37/3056* (2013.01); *H01J 37/3233* (2013.01); *H01J 37/3244* (2013.01); *H01L 21/3065* (2013.01); *H01L 21/31105* (2013.01); *H01L 21/32131* (2013.01); *H01L 21/76892* (2013.01); *H01J 2237/3151* (2013.01); *H01J 2237/31744* (2013.01); *H01J 2237/31749* (2013.01); *H01J 2237/334* (2013.01)

(58) Field of Classification Search
CPC .......................................... H01J 2237/31749
USPC ...................................................... 204/298.36
See application file for complete search history.

(56) References Cited

U.S. PATENT DOCUMENTS

| | | | |
|---|---|---|---|
| 5,188,705 | A | 2/1993 | Swanson et al. |
| 5,435,850 | A | 7/1995 | Rasmussen |

(Continued)

FOREIGN PATENT DOCUMENTS

EP   1465243   10/2004

*Primary Examiner* — Timon Wanga
(74) *Attorney, Agent, or Firm* — Scheinberg & Associates, P.C.; John E. Hillert

(57) ABSTRACT

A method and system for improved planar deprocessing of semiconductor devices using a focused ion beam system. The method comprises defining a target area to be removed, the target area including at least a portion of a mixed copper and dielectric layer of a semiconductor device; directing a precursor gas toward the target area; and directing a focused ion beam toward the target area in the presence of the precursor gas, thereby removing at least a portion of a first mixed copper and dielectric layer and producing a uniformly smooth floor in the milled target area. The precursor gas causes the focused ion beam to mill the copper at substantially the same rate as the dielectric. In a preferred embodiment, the precursor gas comprises methyl nitroacetate. In alternative embodiments, the precursor gas is methyl acetate, ethyl acetate, ethyl nitroacetate, propyl acetate, propyl nitroacetate, nitro ethyl acetate, methyl methoxyacetate, or methoxy acetylchloride.

20 Claims, 5 Drawing Sheets

Related U.S. Application Data

(60) Provisional application No. 61/828,128, filed on May 28, 2013.

(51) Int. Cl.
  *H01L 21/768* (2006.01)
  *H01L 21/311* (2006.01)
  *H01J 37/32* (2006.01)

(56) References Cited

U.S. PATENT DOCUMENTS

| | | |
|---|---|---|
| 5,851,413 A | 12/1998 | Casella et al. |
| 6,211,527 B1 | 4/2001 | Chandler |
| 6,268,608 B1 | 7/2001 | Chandler |
| 6,514,866 B2 | 2/2003 | Russell et al. |
| 6,824,655 B2 | 11/2004 | Makarov et al. |
| 7,670,956 B2 | 3/2010 | Bret et al. |
| 7,883,630 B2 | 2/2011 | Makarov et al. |
| 2004/0082176 A1* | 4/2004 | Kane ............... G01N 21/68 438/690 |
| 2005/0072756 A1 | 4/2005 | Makarov et al. |
| 2010/0197142 A1 | 8/2010 | Randolph et al. |
| 2012/0211356 A1 | 8/2012 | Makarov |
| 2013/0118896 A1 | 5/2013 | Foster et al. |
| 2013/0248356 A1 | 9/2013 | Rue |

\* cited by examiner

GAS INJECTION SYSTEM WITH PRECURSOR FOR PLANAR DEPROCESSING OF SEMICONDUCTOR DEVICES USING A FOCUSED ION BEAM

This Application claims priority from U.S. patent application Ser. No. 13/910,761, filed Jun. 5, 2013, which claims priority from U.S. Provisional Patent Application No. 61/828,128, filed May 28, 2013, both of which are hereby incorporated by reference.

TECHNICAL FIELD OF THE INVENTION

The present invention relates to the field of charged particle beam processing and, in particular, to a method for uniformly removing multiple layers of conductor and dielectric from semiconductor circuits using a focused ion beam.

BACKGROUND OF THE INVENTION

Semiconductor devices such as microprocessors can be made up of millions of transistors, each interconnected by thin metallic lines branching over several levels and isolated electrically from each other by layers of dielectric materials. When a new semiconductor design is first produced in a semiconductor fabrication facility, it is typical to find that the design does not operate exactly as expected. It is then necessary for the engineers who designed the device to test their design and "rewire" it to achieve the desired functionality. Due to the complexity of building a semiconductor device in the semiconductor fabrication facility, it typically takes weeks or months to have the re-designed device produced. Further, the changes implemented frequently do not solve the problem or expose a yet further difficulty in the design. The process of testing, re-designing and re-fabrication can significantly lengthen the time to market new semiconductor devices.

Circuit editing—the process of modifying a circuit during its development without having to remanufacture the whole circuit—provides tremendous economic benefits by reducing both processing costs and development cycle times. In most cases, the feature to be modified is buried under other material, such as insulating layers, and, in the case of "flip chips," semiconductor layers. Therefore it is typically necessary to mill down through these layers of materials to reach the metal feature of interest without damaging adjacent circuit features. This is known as deprocessing. Deprocessing is not limited to circuit editing applications. Deprocessing can be used in other applications where access to buried features located under other material is required. For example, FIB-based Failure Analysis (FA) might require deprocessing to allow access to hidden, lower metal layers for the purpose of fault isolation using passive voltage contrast, or to expose features for electrical probing.

Over the past decade, techniques have been developed to allow Focused Ion Beam (FIB) systems to reduce the time required for this procedure of perfecting a design. FIB systems produce a narrow, focused beam of charged particles (hereinafter referred to as ions) which is typically scanned across a specimen in a raster fashion, similar to a cathode ray tube. Commercial FIB systems typically use positively charged ions from liquid metal ion sources or plasma ion sources. Modern FIB systems can be used to form an image of a sample surface much like an electron microscope. The intensity at each point of the image is determined by the current of secondary electrons or other particles ejected by the ion beam at the corresponding point on the substrate. The ion beam can also be used to remove material from the sample surface or to deposit material (typically by using a gas that decomposes in the presence of the ion beam and deposits material onto the surface.). When used to remove material, the ions in the focused ion beam physically eject atoms or molecules from the surface by sputtering, that is, by a transfer of momentum from the incoming ions to the atoms at the surface.

FIB instruments can be used to mill away a target area of a semiconductor device to expose the layers buried within the device. The target area, typically comprising mixed layers of conductor and dielectric, can be milled by rastering a beam of ions across the area of interest. The beam is typically scanned across the area to be milled using digital electronics that step the beam from point to point. The distance between points is referred to as the pixel spacing. Pixel spacing is typically less than the beam spot size, that is, each subsequent beam position overlaps the previous position in an attempt to obtain a uniform cut and a smooth finish. This method is referred to as 'Default Milling'. Milling methods have been well documented, for example, in U.S. Pat. No. 5,188,705 to Swanson, et. al. for "Method of Semiconductor Device Manufacture".

During FIB processing for circuit editing or failure analysis (FA), it is common to have to deprocess a relatively large area of multiple layers, each layer having copper and dielectric materials embedded in the same layer. When these types of mixed layers are sputtered by a FIB, the difference in sputtering rate between copper and the dielectric material also tends to result in a non-uniform milling floor.

Chemistries have been developed that selectively attack certain materials, causing it to sputter more quickly in the presence of certain gases than with just the ion beam alone. This process is well-known within the art and is commonly referred to as Gas Assisted Etching (GAE). Because it speeds up the removal process, GAE can be used, for example, to mill relatively large areas of a surface layer or layers to expose underlying layers for observation and testing. However, one drawback with using GAE to mill relatively large areas of a surface layer comprising mixed materials is that the chemistries used to assist FIB milling typically enhance the removal of one material in the presence of other materials. One material is selectively etched at a higher rate than the other, exacerbating the problem of a non-uniform milling floor. For example, U.S. Pat. No. 7,883,630 relates to chemistries for copper removal but emphasizes the selective removal of copper relative to dielectrics, rather than the 1:1 removal rates that are ideal for planar deprocessing. Water can be used for planar deprocessing on semiconductor devices with $Si_3N_4$ etch stops, but it is not effective on modern devices with SiC capping layers.

Although several techniques to improve the uniformity of copper milling are known, none of these techniques adequately solve the problems of milling through mixed copper and dielectric layers. Hence, there is a need for an improved technique to allow more uniform milling through multiple layers of mixed copper and dielectric for planar deproces sing with a focused ion beam.

SUMMARY OF THE INVENTION

An object of the invention, therefore, is to provide a method for more uniformly removing multiple layers of conductor and dielectric—such as the removal of multiple layers consisting of copper and a low k dielectric—in a manner allowing access to active features buried underneath these layers for applications including, but not limited to, circuit editing and failure analysis. An embodiment of the present invention is directed to a method of removing one or more mixed copper and dielectric layers from an area of a target. The method comprises defining a target area to be removed, the target area including at least a portion of a mixed copper and dielectric layer of a semiconductor device; directing a precursor gas toward the target area; and directing a focused ion beam toward the target area in the presence of the precursor gas, thereby removing at least a portion of a first mixed copper and dielectric layer and producing a uniformly smooth floor in the milled target area. The precursor gas causes the focused ion beam to mill the copper at substantially the same rate as the dielectric. In a preferred embodiment, the precursor gas comprises methyl nitroacetate. In alternative embodiments, the precursor gas is methyl acetate, ethyl acetate, ethyl nitroacetate, propyl acetate, propyl nitroacetate, nitro ethyl acetate, methyl methoxyacetate, or methoxy acetylchloride.

Another embodiment of the present invention is directed to a focused ion beam system for removing multiple layers of material. The system comprises an ion source; an ion column including, the ion beam column directing a focused beam of ions from the ion source toward a target area on a semiconductor device, the ion beam column being programmed to direct the focused ion beam to mill away at least a portion of the target area, producing a milling floor having a substantially planar, uniform surface; and a gas injection system for directing a precursor gas toward the target area, the precursor gas causing the focused ion beam to mill, in a mixed layer of copper and dielectric, the copper and the dielectric at substantially the same rate. In a preferred embodiment, the precursor gas comprises methyl nitroacetate. In alternative embodiments, the precursor gas is methyl acetate, ethyl acetate, ethyl nitroacetate, propyl acetate, propyl nitroacetate, nitro ethyl acetate, methyl methoxyacetate, or methoxy acetylchloride.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF PREFERRED EMBODIMENTS

A preferred embodiment of this invention provides a method for uniformly removing multiple layers of mixed conductor and dielectric—such as the removal of multiple layers consisting of copper and low k dielectric—in a manner allowing access to the active features buried underneath these layers for applications including, but not limited to, circuit editing and failure analysis.

Preferred embodiments of the present invention are directed to a method used for milling of materials, particularly copper-based features within semiconductor devices. Although much of the following description is directed toward copper milling and specifically copper milling within semiconductor devices, the apparatus and methods of the present invention could equally be utilized in the milling of other materials. The techniques described herein can be used by themselves or in combination with other techniques. Hence, the scope of the present invention should not be limited to simply the milling of copper-based structures.

Figure 1:
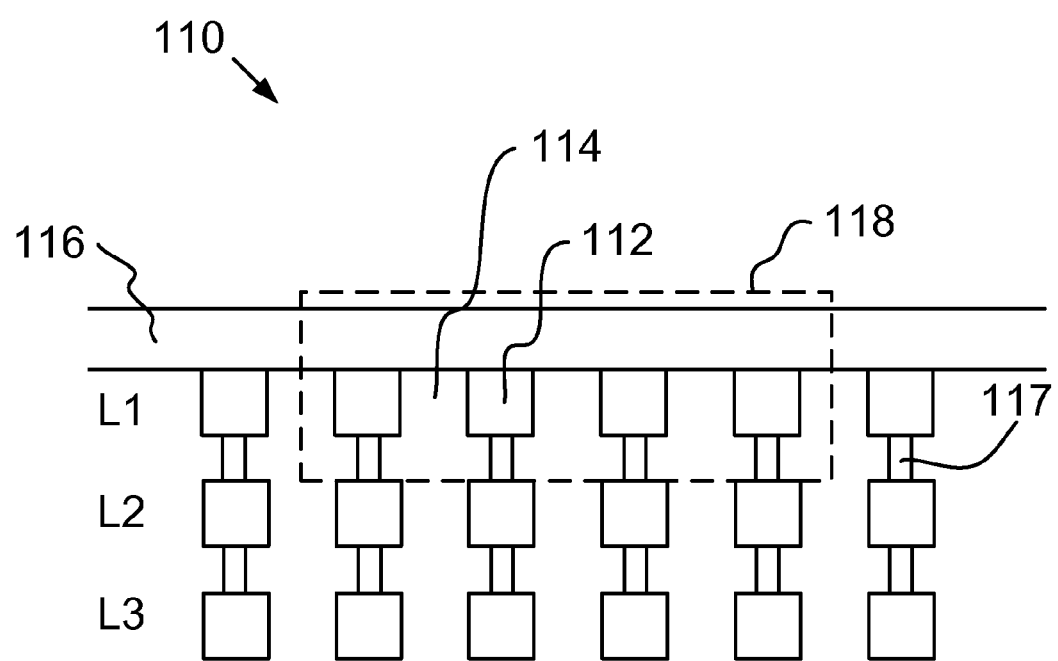
FIG. 1 is a cross sectional view showing schematically a portion of a typical integrated circuit 110.

FIG. 1 is a cross sectional view showing schematically a portion of a typical integrated circuit 110. As shown in FIG. 1, integrated circuit 110 includes multiple layers L1-L3. Each layer L1-L3 includes a plurality of copper conductors 112 separated by a dielectric material 114. The surface of integrated circuit 110 is covered by capping layer 116. Vias 117 connect conductors 112 of one layer to conductors 112 of an adjacent layer. Target box 118 shows two dimensions of an area of mixed metal and dielectric to be removed (for example, width and depth). The third dimension of target box 118 (in this case, length) extends into the page and is not shown in FIG. 1.

Figure 2:
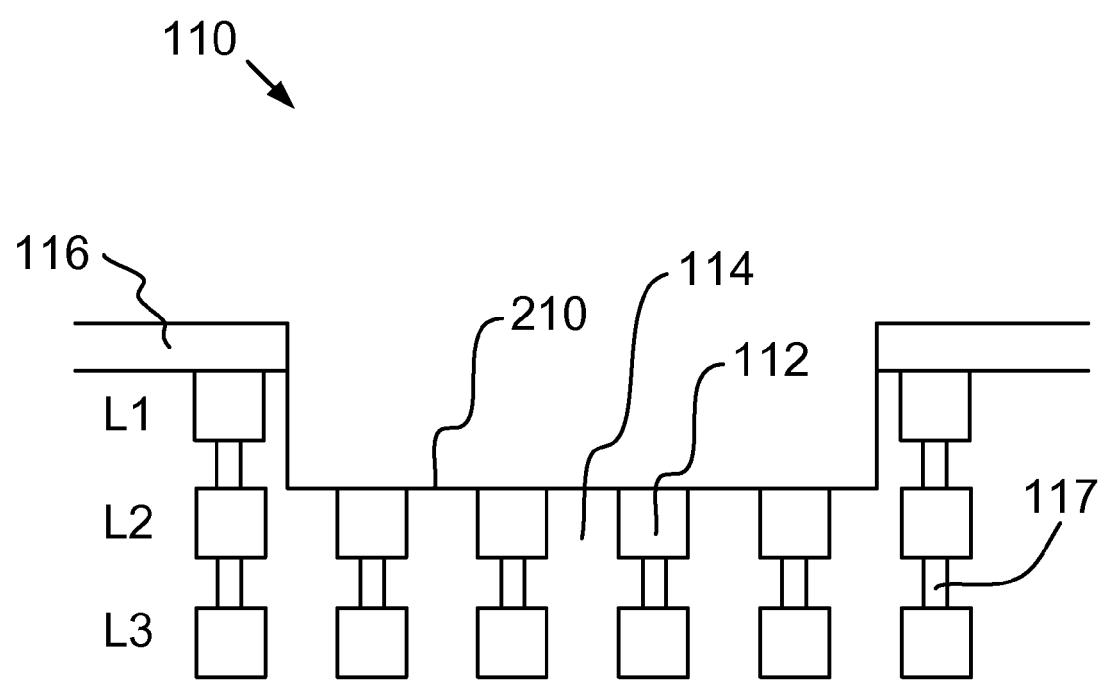
FIG. 2 is a cross sectional view showing schematically a portion of an integrated circuit following a successful deprocessing event.

FIG. 2 is a cross sectional view showing schematically a portion of an integrated circuit following a successful deproces sing event. Only conductors 112 and dielectric 114 within target box 118 were removed during deprocessing (as well as the portion of passivation layer 116 that was within target box 118). No conductors 112 outside of target box 118 were affected by the deprocessing. Milling floor 210 is smooth and uniform, without substantial surface variations in the vertical direction of the cross section, enabling a clear view of the exposed features in layer L2.

Figure 3:
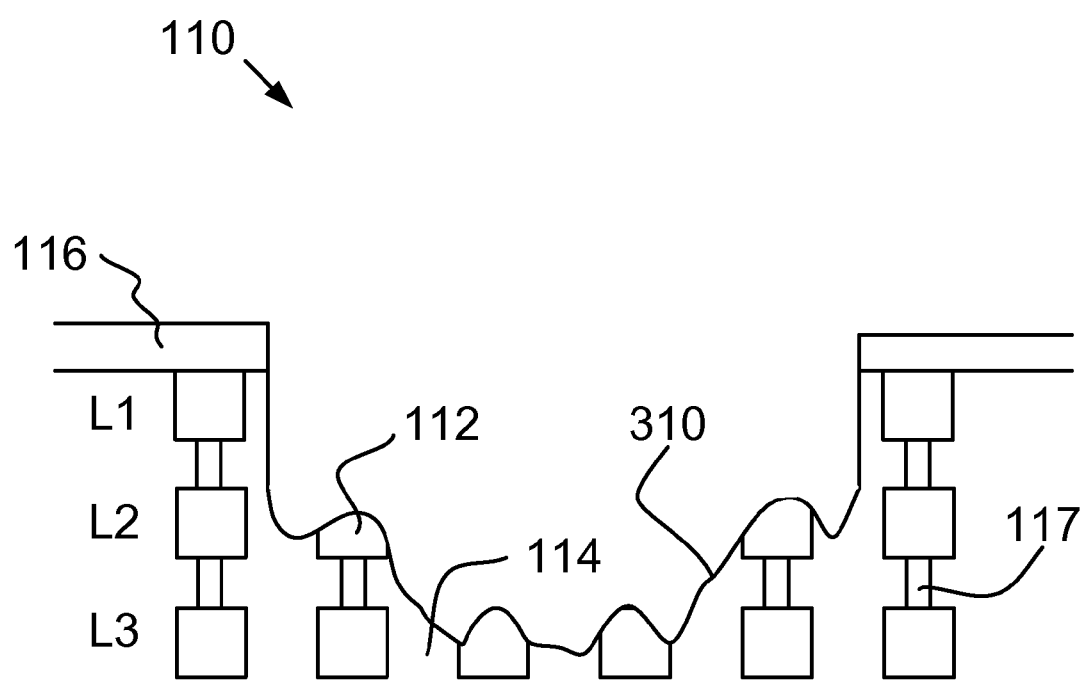
FIG. 3 is a cross sectional view showing schematically a portion of an integrated circuit following an unsuccessful deprocessing event.

FIG. 3 is a cross sectional view showing schematically a portion of an integrated circuit following an unsuccessful deprocessing event. A portion of conductors 112 outside of target box 118, as well as a portion of dielectric 114 outside of target box 118 was removed during deprocessing. In addition, milling floor 310 is neither smooth nor uniform. The non-uniformity makes visualizing and identifying the structures within the layer more difficult. The non-uniformity also increases the difficulty of electrically probing the circuit elements, increasing the likelihood of errors such as probing the wrong element and/or shorting the probe on one of the peaks in the non-uniform milling floor. Additionally, target box 118 is selected to that the layer L1 is milled to expose features of layer L2. In an unsuccessful deprocessing event such as the one shown in FIG. 3, the non-uniform milling causes a portion of layer L2 to be completely removed (which is supposed to be examined) and a portion of layer L3 to be exposed (which is not supposed to be examined).

Deprocessing a target area comprising different materials using conventional focused ion beam milling results in non-uniform milling floors and unsuccessful deprocesing events such as the one shown in FIG. 3. The non-uniform milling floor is due to the fact that the different materials are milled at different rates under the influence of the ion beam (i.e., the materials have different sputter rates). Using known etch-assisting gases makes the problem worse because known etch-assisting gases enhance the removal of one material in the presence of other materials. The selective milling of known etch-assisting gases exacerbates the problem of non-uniform ion beam milling of a target area comprising different materials.

Using precursor gas that causes different materials in the target area to be milled at the same rate under the influence of the ion beam would result in a more uniform milling floor and more successful deprocessing events, such as the example shown in FIG. 2. For target areas comprising a mixed layer of copper conductors and low-k dielectric, Applicants have found that using compounds containing short-chain hydrocarbons and acetate/nitroacetate as a precursor gas causes a focused ion beam to mill copper conductors and low-k dielectrics at substantially similar mill rates. The molecular size and carbon content of these compounds is at the threshold of deposition, which slows down the mill rate of the dielectric so that the mill rate of the dielectric is substantially similar to the mill rate of the copper. The nitro functional group ($NO_2$) increases the boiling point and reduces the vapor pressure of the compound, making the compound more suitable for use in the vacuum chamber of the ion beam system.

In preferred embodiments of the present invention, methyl nitroacetate (MNA) is used as a precursor gas for the removal of "mixed field materials" on integrated circuit (IC) devices comprising copper in porous, ultra low-k dielectric materials with silicon carbide (SiC) capping layers. The MNA reduces the selectivity of FIB milling towards copper and dielectric materials, enabling the FIB to mill the different materials at substantially similar mill rates and thereby producing a more uniform milling floor. Exemplary low-k dielectric materials include, but are not limited to, carbon-doped silicon dioxide, porous silicon dioxide, and porous carbon-doped silicon dioxide. In alternative embodiments, methyl acetate, ethyl acetate, ethyl nitroacetate, propyl acetate, propyl nitroacetate, nitro ethyl acetate, methyl methoxyacetate, or methoxy acetylchloride can be used as the precursor gas.

Figure 4:
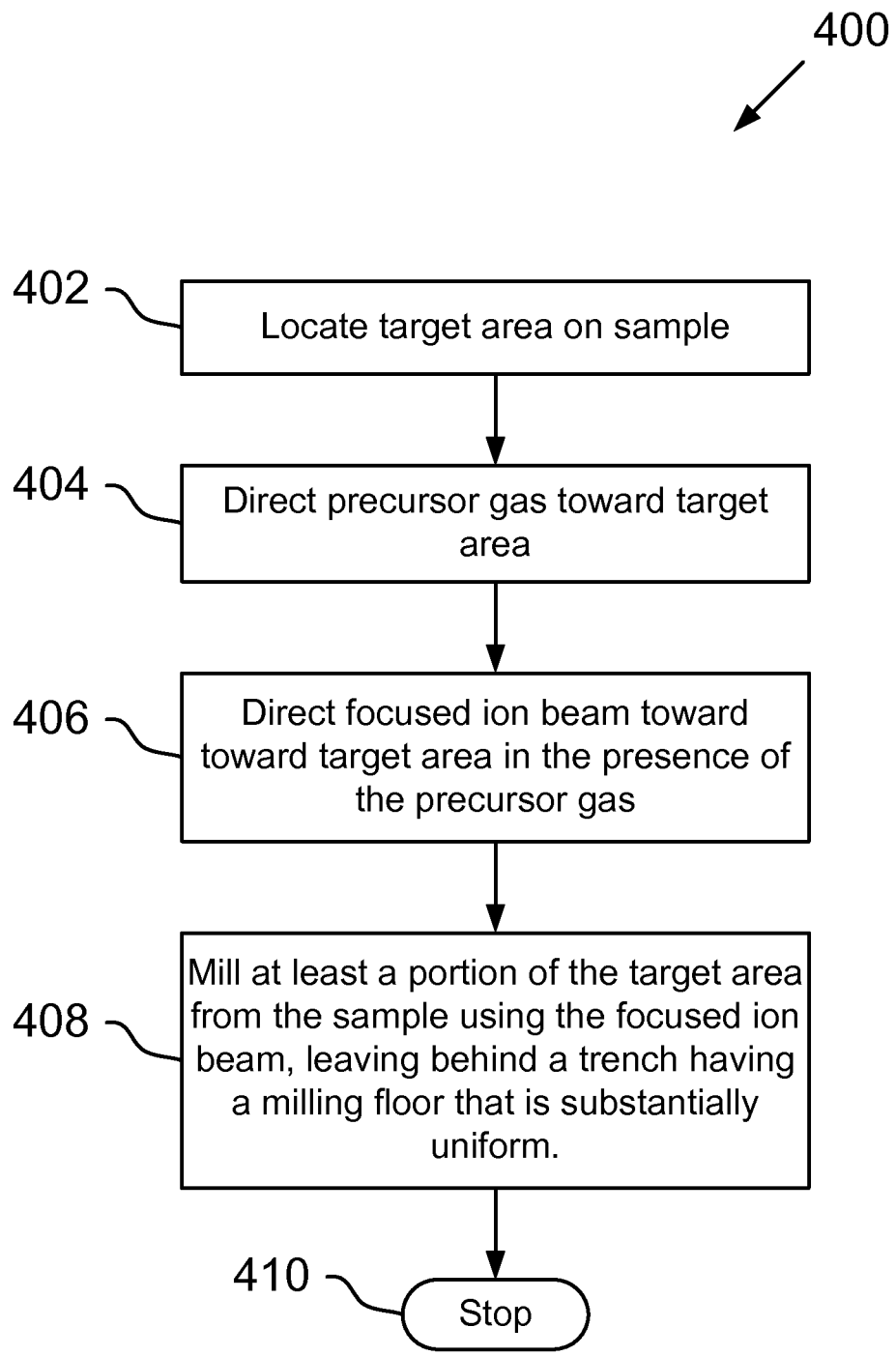
FIG. 4 is a flowchart showing the steps of a preferred embodiment of the present invention.

FIG. 4 is a flowchart 400 showing the steps involved in a preferred embodiment of the present invention which could be used to mill away multiple layers of mixed field materials. In step 402, a target area to be milled is located on the sample. Typically, where one or more layers of copper and dielectric must be removed from a semiconductor device to allow circuit editing or failure analysis activities, the target area will comprise a repair box sufficiently large to expose the appropriate buried active feature for editing. Further, where more than two layers of copper and dielectric must be removed, the initial target area would preferably be defined as a repair box larger than the final desired repair box. If, for example, a 20 μm×20 μm repair box is required for the final layer, the initial target area would preferably be defined as a repair box larger than 20 μm×20 μm. In order to compensate for undesirable over-etching that occurs at the edges of a repair box, for every two layers to be removed, the repair box can be reduced by 2-3 μm to eliminate edge enhancement for the final 20 μm×20 μm repair box. To illustrate, if eight layers are to be removed, the initial repair box could be 30 μm×30 μm. For every two layers removed, the repair box could be reduced by 2-3 μm so that the final repair box (used when removing the eighth dummy copper layer) could be 20 μm×20 μm.

In step 404, the precursor gas is directed toward the target area. The gas can be directed at the target area using a gas injection system (GIS). The nozzle of the GIS can precisely direct the flow of the gas in the location of the target area. As mentioned above, in preferred embodiments of the present invention, methyl nitroacetate (MNA) is used as the precursor gas. In alternative embodiments, methyl acetate, ethyl acetate, ethyl nitroacetate, propyl acetate, propyl nitroacetate, nitro ethyl acetate, methyl methoxyacetate, or methoxy acetylchloride can be used as the precursor gas. In step 406, the focused ion beam is directed toward the target area in the presence of the precursor gas. The precursor gas causes the ion beam to mill the dielectric layer more slowly, reducing the mill rate of the dielectric such that the mill rate of the dielectric is substantially similar to the mill rate of the copper. In step 408, the focused ion beam mills at least a portion of the target area from the sample in the presence of the precursor gas, leaving behind a trench having a milling floor that is substantially uniform. A typical milling floor is 50 μm×50 μm, but the size can vary as detailed above with respect to multiple layers. The method ends at terminator 410.

Figure 5:
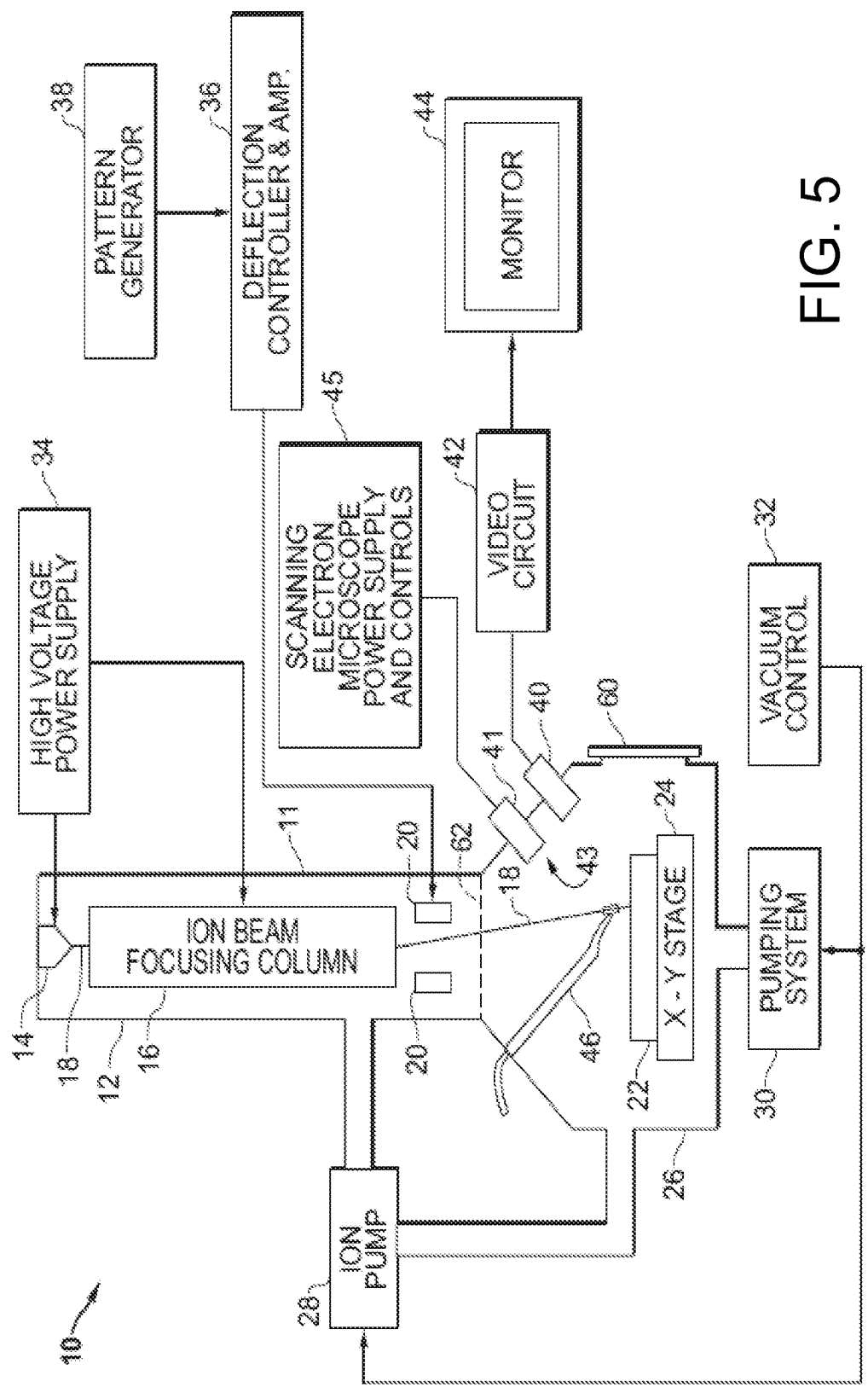
FIG. 5 shows schematically a typical focused ion beam system used in a preferred embodiment of the invention.

FIG. 5 shows a typical focused ion beam system 10 used to implement the present invention. Focused ion beam system 10 includes an evacuated envelope 11 having an upper neck portion 12 within which are located a liquid metal ion source 14 and a focusing column 16 including extractor electrodes and an electrostatic optical system. Ion beam 18 passes from source 14 through column 16 and between electrostatic deflection means schematically indicated at 20 toward sample 22, which comprises, for example, a semiconductor device positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32. The vacuum system provides within chamber 26 a vacuum of between approximately $1\times10^{-7}$ Torr and $5\times10^{-4}$ Torr. When using the precursor gas, the chamber background pressure may rise, typically to about $1\times10^{-5}$ Torr.

High voltage power supply 34 is connected to liquid metal ion source 14 as well as to appropriate electrodes in focusing column 16 for forming an approximately 1 keV to 60 keV ion beam 18 and directing the same downwardly. Deflection controller and amplifier 36, operated in accordance with a prescribed pattern provided by pattern generator 38, is coupled to deflection plates 20 whereby beam 18 may be controlled to trace out a corresponding pattern on the upper surface of sample 22. In some systems the deflection plates are placed before the final lens, as is well known in the art.

The source 14 provides the ions used in the ion beam. In preferred embodiments of the present invention, a plasma ion source, such as a Xenon ($Xe^+$) ion source, is used. In alternative embodiments, a liquid metal ion source, such as a Gallium ($Ga^+$) ion source, is used. The source typically is capable of being focused into a sub one-tenth micron wide beam at sample 22 for either modifying the sample 22 by ion milling, enhanced etch, material deposition, or for the purpose of imaging the sample 22. A charged particle multiplier 40 used for detecting secondary ion or electron emission for imaging is connected to video circuit and amplifier 42, the latter supplying drive for video monitor 44 also receiving deflection signals from controller 36. The location of charged particle multiplier 40 within chamber 26 can vary in different embodiments. For example, a charged particle multiplier 40 can be coaxial with the ion beam and include a hole for allowing the ion beam to pass. A scanning electron microscope 41, along with its power supply and controls 45, are optionally provided with the FIB system 10.

A gas delivery system 46 extends into lower chamber 26 for introducing and directing a gaseous vapor toward sample 22. U.S. Pat. No. 5,851,413 to Casella et al. for "Gas Delivery Systems For Particle Beam Processing," assigned to the assignee of the present invention, describes a suitable fluid delivery system 46. Another gas delivery system is described in U.S. Pat. No. 5,435,850 to Rasmussen for a "Gas Injection System," also assigned to the assignee of the present invention. Gas delivery system 46 directs the precursor gas toward the target area.

A door 60 is opened for inserting sample 22 onto stage 24, which may be heated or cooled, and also for servicing an internal gas supply reservoir, if one is used. The door is interlocked so that it cannot be opened if the system is under vacuum. The high voltage power supply provides an appropriate acceleration voltage to electrodes in ion beam column 16 for energizing and focusing ion beam 18. When it strikes sample 22, material is sputtered, that is physically ejected, from the sample. Focused ion beam systems are commercially available, for example, from FEI Company, Hillsboro, Oregon, the assignee of the present application.

Embodiments of the present invention are directed to a method of removing one or more mixed copper and dielectric layers from an area of a target. The method comprises: defining a target area to be removed, the target area including at least a portion of a mixed copper and dielectric layer of a semiconductor device; directing a precursor gas toward the target area; and directing a focused ion beam toward the target area in the presence of the precursor gas, thereby removing at least a portion of a first mixed copper and dielectric layer and producing a uniformly smooth floor in the milled target area; in which the precursor gas causes the focused ion beam to mill the copper at substantially the same rate as the dielectric.

The method can include a precursor gas selected from a group comprising: methyl acetate, methyl nitroacetate, ethyl acetate, ethyl nitroacetate, propyl acetate, propyl nitroacetate, nitro ethyl acetate, methyl methoxyacetate, and methoxy acetylchloride.

The method can include removing two or more mixed copper and dielectric layers. The two or more mixed copper and dielectric layers can be separated by a layer of dielectric. Each mixed copper and dielectric layer can be removed, producing a substantially uniform floor in the milled target area, before the next mixed copper and dielectric layer is milled.

The method can include a dielectric comprising a low-k dielectric. The dielectric is selected from a group comprising: carbon-doped silicon dioxide, porous silicon dioxide, and porous carbon-doped silicon dioxide.

The method can include milling so that the floor of the milled target area is at least 50 micrometers in length by 50 micrometers in width.

The method can include a target area that includes a silicon carbide (SiC) capping layer.

Other embodiments of the present invention are directed to a focused ion beam system for removing multiple layers of material. The system comprises: an ion source; an ion column including, the ion beam column directing a focused beam of ions from the ion source toward a target area on a semiconductor device, the ion beam column being programmed to direct the focused ion beam to mill away at least a portion of the target area, producing a milling floor having a substantially planar, uniform surface; and a gas injection system for directing a precursor gas toward the target area, the precursor gas causing the focused ion beam to mill, in a mixed layer of copper and dielectric, the copper and the dielectric at substantially the same rate.

The focused ion beam system can include an ion source that is a plasma ion source.

The focused ion beam system can include ions in the ion beam which are selected from a group comprising: $Xe^+$, $Ga^+$, $Ar^+$, $Kr^+$, $O^+$, $O_2^+$, $N^+$, $NO^+$, $NO_2^+$, $Au^+$, $Bi^+$, $Si^+$, $Ge^+$. The focused ion beam system can include a precursor gas that is selected from a group comprising: methyl acetate, methyl nitroacetate, ethyl acetate, ethyl nitroacetate, propyl acetate, propyl nitroacetate, nitro ethyl acetate, methyl methoxyacetate, or methoxy acetylchloride.

The focused ion beam system can include a dielectric comprising a low-k dielectric. The dielectric can be selected from a group comprising: carbon-doped silicon dioxide, porous silicon dioxide, and porous carbon-doped silicon dioxide.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A focused ion beam system for removing multiple layers of material, the system comprising:
   an ion source;
   an ion beam column configured to mill at least a portion of a target area on a sample by focusing ions from the ion source into a focused ion beam and directing the focused ion beam onto the target area; and
   a gas injection system comprising a precursor gas selected from the group consisting of methyl acetate, methyl nitroacetate, ethyl acetate, ethyl nitroacetate, propyl acetate, propyl nitroacetate, nitro ethyl acetate, methyl methoxyacetate, and methoxy acetylchloride.

2. The focused ion beam system of claim 1, in which the ion source is a plasma ion source.

3. The focused ion beam system of claim 1, in which the ions are selected from the group consisting of $Xe^+$, $Ga^+$, $Ar^+$, $Kr^+$, $O^+$, $O_2^+$, $N^+$, $NO^+$, $NO_2^+$, $Au^+$, $Bi^+$, $Si^+$, $Ge^+$.

4. The focused ion beam system of claim 1, in which the sample comprises a semiconductor device having a mixed layer of copper and dielectric.

5. The focused ion beam system of claim 4, in which the gas injection system is configured to direct the precursor gas toward the at least a portion of the target area such that the precursor gas causes the focused ion beam to mill the copper and the dielectric at substantially the same rate.

6. The focused ion beam system of claim 5, in which the ion beam column is programmed to direct the focused ion beam to mill away the at least a portion of the target area such that a milling floor in the semiconductor device having a substantially planar, uniform surface is produced.

7. The focused ion beam system of claim 6, in which the dielectric comprises a low-k dielectric.

8. The focused ion beam system of claim 7, in which the dielectric is selected from a group comprising: carbon-doped silicon dioxide, porous silicon dioxide, and porous carbon-doped silicon dioxide.

9. The focused ion beam system of claim 1, further comprising a lower vacuum chamber configured to contain the sample as the focused ion beam mills the at least a portion of the target area.

10. The focused ion beam system of claim 9, further comprising a vacuum system configured to maintain pressures in the lower vacuum chamber in a range of from approximately $1 \times 10^{-7}$ Torr to approximately $5 \times 10^{-4}$ Torr as the focused ion beam mills the at least a portion of the target area.

11. The focused ion beam system of claim 10, in which the ion source is capable of producing ions that can be focused into a sub one-tenth micron wide focused ion beam.

12. A gas injection system, comprising:
a precursor gas selected from the group consisting of methyl acetate, methyl nitroacetate, ethyl acetate, ethyl nitroacetate, propyl acetate, propyl nitroacetate, nitro ethyl acetate, methyl methoxyacetate, and methoxy acetylchloride,
wherein the gas injection system is configured to direct the precursor gas toward a target area on a sample disposed within a lower chamber of a focused ion beam system.

13. The gas injection system of claim 12, in which the sample is a sample positioned on a stage located within the lower chamber.

14. The gas injection system of claim 13, in which the stage is a movable X-Y stage.

15. The gas injection system of claim 12, in which the lower chamber is a vacuum chamber.

16. The gas injection system of claim 12, in which the gas injection system is configured to direct the precursor gas toward a target area on a sample inside a focused ion beam system as the sample is milled by a focused ion beam.

17. The gas injection system of claim 16, in which the sample comprises a semiconductor device having a mixed layer of copper and dielectric.

18. The gas injection system of claim 17, in which the focused ion beam system is a focused ion beam system comprising an ion source, a high voltage power supply, a focused ion beam column, a lower chamber containing the semiconductor device, and a vacuum system.

19. The gas injection system of claim 18, in which the gas injection system is configured to direct the precursor gas toward a target area on the semiconductor device as the focused ion beam column directs a focused ion beam onto the target area such that the precursor gas causes the focused ion beam to mill the copper and the dielectric at substantially the same rate.

20. The gas injection system of claim 19, in which:
the ion source is capable of producing ions that can be focused into a focused ion beam having a sub one-tenth micron width at the target;
the vacuum system is a vacuum system configured to maintain pressures in the lower chamber in a range of from approximately $1 \times 10^{-7}$ Torr to approximately $5 \times 10^{-4}$ Torr; and
the high voltage power supply configured to produce focused ion beams having energies in a range of from approximately 1 keV to approximately 60 keV.

* * * * *